US006879643B2

(12) United States Patent
Dedieu et al.

(10) Patent No.: US 6,879,643 B2
(45) Date of Patent: Apr. 12, 2005

(54) PROCESS AND DEVICE FOR CONTROLLING THE PHASE SHIFT BETWEEN FOUR SIGNALS MUTUALLY IN PHASE QUADRATURE

(75) Inventors: Sébastien Dedieu, St. Martin d'Heres (FR); Frédéric Paillardet, Aix les Bains (FR); Isabelle Telliez, Berkeley, CA (US)

(73) Assignee: STMicroelectronics SA, Montrouge (FR)

(*) Notice: Subject to any disclaimer, the term of this patent is extended or adjusted under 35 U.S.C. 154(b) by 712 days.

(21) Appl. No.: 09/859,731

(22) Filed: May 17, 2001

(65) Prior Publication Data

US 2002/0051091 A1 May 2, 2002

(30) Foreign Application Priority Data

May 19, 2000 (FR) .......................................... 00 06468

(51) Int. Cl.[7] .......................... H03K 9/00; H04L 27/06; H04L 27/14; H04L 27/22
(52) U.S. Cl. ........................ 375/316; 348/725; 455/3.02
(58) Field of Search ................................ 348/723, 726, 348/725; 332/103; 375/316, 327, 329, 371, 376, 377; 455/3.02; 327/231, 237, 238, 254

(56) References Cited

U.S. PATENT DOCUMENTS

| 3,755,738 | A | * | 8/1973 | Gitlin et al. ................. 375/235 |
|---|---|---|---|---|
| 4,358,741 | A | * | 11/1982 | Nardin ............................ 331/2 |
| 4,794,556 | A | * | 12/1988 | Rader ........................... 708/320 |
| 5,060,298 | A | | 10/1991 | Waugh et al. ............... 455/326 |
| 5,391,996 | A | * | 2/1995 | Marz ............................ 327/158 |
| 5,455,543 | A | | 10/1995 | Kechkaylo .................. 332/103 |
| 5,796,307 | A | * | 8/1998 | Kumagai et al. ........... 330/149 |
| 5,898,913 | A | | 4/1999 | Pengelly et al. ............ 455/326 |
| 6,438,179 | B1 | * | 8/2002 | Hwang ........................ 375/322 |

FOREIGN PATENT DOCUMENTS

FR 2670975 6/1992 ........... H04L/27/18

* cited by examiner

*Primary Examiner*—Jean B. Corrielus
(74) *Attorney, Agent, or Firm*—Lisa K. Jorgenson; Allen, Dyer, Doppelt, Milbrath & Gilchrist, P.A.

(57) ABSTRACT

At least a first base signal and a second base signal are mutually in quadrature and both are capable of mutually exhibiting a quadrature error. These signals are used to formulate two pairs of delayed signals that includes a first delayed signal that is delayed with respect to the first base signal, a second signal delayed in phase opposition with respect to the first delayed signal, a third signal delayed with respect to the second base signal, and a fourth delayed signal in phase opposition with respect to the third delayed signal. The value of each of the delays is continuously adjusted using two differential signals arising from a direct or an indirect cross-mixing of the two pairs of delayed signals to obtain the four delayed signals virtually in quadrature.

29 Claims, 5 Drawing Sheets

PROCESS AND DEVICE FOR CONTROLLING THE PHASE SHIFT BETWEEN FOUR SIGNALS MUTUALLY IN PHASE QUADRATURE

FIELD OF THE INVENTION

The invention relates to tuners, and more particularly, to the control of a phase shift between four signals mutually in phase quadrature. The invention applies advantageously, but not limitingly, to satellite-based digital telebroadcasting as defined in the Digital Video Broadcasting-Satellite (DVB-S) European specification. This specification is based on the MPEG compression standards and uses quadrature digital modulation to convey the information on a large number of orthogonal carriers, such as Orthogonal Frequency Division Multiplexing (OFDM), for example.

BACKGROUND OF THE INVENTION

Television signals originating from a satellite are amplified and converted into a predetermined frequency band (typically 950–2150 MHZ) using a parabolic dish and a low-noise converter located at the focus of the parabolic dish. This signal is then directed to the input of the tuner of the receiver. The purpose of the tuner is to select the desired channel and to output a baseband signal on the in-phase path (I path) and on the quadrature path (Q path). This signal is then converted into a digital signal and demodulated.

The channel decoding processing comprises a block which distinguishes the logic zeros from the logic ones, typically by means of majority logic. The block also performs the entire error correction using Viterbi decoding, deinterlacing, Reed-Solomon decoding or deshuffling, for example. The channel decoding device outputs packets which are decoded in a conventional manner in a source decoding device in accordance with the MPEG standards to redeliver at the output the initial audio and video signals transmitted via the satellite.

The tuner is associated with a local oscillator which generates the quadrature radio frequency signals. It is vital to control this quadrature, since any quadrature errors between the signals arising from the oscillator and delivered to the mixers of the tuner leads to an inaccuracy in the decoding of the digital information received. Also, control of the quadrature must be performed over the entire frequency of the signals received. By way of indication, the development specifications specify a phase shift error that shall remain less than a few degrees, such as 3°, for example.

Within the field of portable telephones, the transmission of data between a portable telephone and its base is not continuous, but is in the form of packets. Also, between the transmission of these packets, it is possible for the portable telephone to recalibrate the quadrature of the local oscillator by injecting a test signal, for example.

However, such calibration is not possible in digital television. This is because the information is transmitted continuously and no time is available to perform any calibration of the local oscillator. One approach includes acting directly on the local oscillator to improve its quality. However, this poses significant technological problems, thus having a direct impact on manufacturing costs.

Moreover, the doctoral thesis presented by Patricia Coget (12 Jul. 1989, University of Limoges) entitled "Design of a broadband microwave monolithic 0–90° phase shifter for radio beams", discloses a broadband monolithic 0–90° phase shifter integrated on an ASGA substrate for a radio receiver. To operate this circuit over a broad frequency band, use is made of a slaved system that includes a controllable phase shifter, a phase comparator, an amplifier and a loop filter.

However, such a circuit has numerous drawbacks. One of these drawbacks resides in the structure of the phase shifter. The phase shifter is formed of capacitive resistive cells, thus requiring very accurate matching of the components when constructing the phase shifter. Moreover, the local oscillator described in this prior art document delivers two signals in phase opposition from which are formed four signals mutually in quadrature. However, if a phase shift error exists between the two signals delivered by the local oscillator, this phase shift error also persists between the two phase opposition signals delivered by the phase shifter, and also between the other two phase opposition signals delivered by the phase shifter.

Furthermore, the slaving according to this prior art comprises a single control of the phase shifter. This is very penalizing with regards to the elimination of any noise. Finally, such a circuit is not fully integrated and, in any event, does not lend itself to complete integration on a silicon substrate because such a substrate has a propensity to propagate noise.

SUMMARY OF THE INVENTION

In view of the foregoing background, an object of the present invention is to control the phase shift between four signals mutually in phase quadrature which is almost insensitive to noise, is simple to carry out, and is fully integrated on a silicon substrate.

To achieve these objectives, the invention provides, in particular, for a phase shift to be controlled by an entirely differential phase lock loop. The use of a differential structure renders the device according to the invention especially insensitive to noise.

The invention therefore provides a process for controlling the phase shift between four signals mutually in phase quadrature, in which at least a first base signal (for example, a signal regarded as reference signal and consequently having a phase of zero), and a second base signal (for example, a signal having a phase of 90°) in quadrature with respect to the first base signal. This second base signal is likely to exhibit a quadrature error with respect to the first base signal. The first and second base signals are used to formulate a first pair of signals delayed by a first adjustable delay. This first pair of delayed signals comprises a first signal delayed with respect to the first base signal, and a second delayed signal in phase opposition with respect to the first delayed signal.

A second pair of signals delayed by a second adjustable delay is also formulated. This second pair of signals comprises a third signal delayed with respect to the second base signal, and a fourth delayed signal in phase opposition with respect to the third delayed signal.

The value of each of the delays is then adjusted continuously using two differential signals arising from direct or indirect cross-mixings of the two pairs of delayed signals so as to increase the value of one of the two delays and to decrease the value of the other delay to obtain the four delayed signals virtually in quadrature independently of the quadrature error. It should be noted that within the meaning of the present invention, a direct mixing signifies that the delayed signals are used directly, whereas an indirect mixing signifies that signals arising from these delayed signals are used as shaped signals, for example.

According to one mode of implementation of the invention, the first pair of delayed signals is mixed directly or indirectly with the second pair of delayed signals. This second pair of delayed signals appears to control the mixing and is mixed directly or indirectly with the first pair of delayed signals. The first pair of delayed signals appears to be in control of the mixing. A first pair of differential signals and a second pair of differential signals are then obtained as a result of these mixings. These two pairs both are representative of the quadrature error between the first delayed signal and the third delayed signal.

Low-pass filtering is carried out and the two pairs of differential signals are summed to obtain a pair of summed differential signals. The value of the first delay is continuously adjusted using one of the two summed differential signals while the value of the second delay is continuously adjusted using the other summed filtered differential signal. This is done to increase the value of one of the two delays, and to decrease the value of the other delay to obtain the four delayed signals virtually in quadrature independently of the quadrature error.

To obtain better effectiveness during the mixing, the delayed signals are advantageously shaped before mixing to transform them into square signals, for example. To obtain better accuracy with respect to the adjustment of the value of the delays, an integration of the two summed filtered differential signals is performed. Then the adjustment of the value of the delays is performed using these integrated differential signals. According to one mode of implementation, the integrating filter is isolated from the noise generated during the phase of delaying the base signals.

Moreover, although it would theoretically be possible to formulate the pairs of delayed signals using only the first base signal and the second base signal. The mean values of these signals may be used as supplementary signals, for example. These pairs of delayed signals are formulated, according to one mode of implementation of the invention, not only from these two base signals, but also from a third base signal substantially in phase opposition with respect to the first base signal, and a fourth base signal substantially in phase opposition with respect to the second base signal.

The invention also proposes a device for controlling the phase shift between four signals mutually in phase quadrature. The device includes a generator possessing a first output for generating at least a first base signal, and a second output for generating at least a second base signal in quadrature with respect to the first base signal, and is likely to exhibit a quadrature error with respect to the first base signal.

The device further includes first and second delay cells. The first delay cell is connected to the first output of the generator and includes a delay control input. The first delay cell is able to deliver a first pair of signals delayed by a first adjustable delay. This first pair of delayed signals comprises a first signal delayed with respect to the first base signal, and a second delayed signal in phase opposition with respect to the first delayed signal. The second delay cell is connected to the second output of the generator and includes a delay control input. This second delay cell is able to deliver a second pair of signals delayed by a second adjustable delay. The second pair of delayed signals comprises a third signal delayed with respect to the second base signal, and a fourth delayed signal in phase opposition with respect to the third delayed signal.

The device further includes differential means of adjustment connected between the outputs of the delay cells and their control inputs, and is able to continuously adjust the value of each of the delays using two differential signals arising from direct or indirect cross-mixings of the two pairs of delayed signals. This is done to increase the value of one of the two delays, and to decrease the value of the other delay to obtain the four delayed signals virtually in quadrature independently of the quadrature error.

According to one embodiment, the means of adjustment comprises a first mixer connected to the outputs of the first and second delay cells. This is done for directly or indirectly mixing the first pair of delayed signals with the second pair of delayed signals appearing to control the mixing. A first pair of differential signals representative of the quadrature error between the first delayed signal and the third delayed signal is also delivered.

A second mixer is connected to the outputs of the first and second delay cells for directly or indirectly mixing the second pair of delayed signals with the first pair of delayed signals appearing to control the mixing. A second pair of differential signals representative of the quadrature error between the first delayed signal and the third delayed signal is also delivered.

A first low-pass filter is connected to the two outputs of the first mixer, a second low-pass filter is connected to the two outputs of the second mixer, and summation means are connected to the outputs of the two low-pass filters.

Moreover, one of the outputs of the summation means is linked to the delay control input of one of the delay cells, while the other output of the summation means is linked to the delay control input of the other delay cell. This is done to continuously adjust the value of the first delay and of the second delay by increasing the value of one of the two delays and by decreasing the value of the other delay to obtain the four delayed signals virtually in quadrature independently of the quadrature error.

According to one embodiment of the invention, the device also comprises signal shaping means connected between the inputs of the mixers and the outputs of the delay cells. Each delay cell advantageously comprises a variable-load differential comparator. According to another embodiment of the invention, each mixer is a ring-like passive mixer formed using four transistors mounted in a ring.

The device moreover advantageously comprises an active differential integrating filter with a common mode control, connected between the two outputs of the summation means and the two delay control inputs of the two delay cells. The device moreover preferably comprises isolation means connected between the outputs of the integrating filter and the two delay control inputs of the two delay cells. These isolation means are able to isolate the integrating filter from the noise generated by the delay cells.

The device according to the invention is advantageously integrated on a silicon substrate. The invention also proposes a receiver for satellite digital television signals, comprising a tuning device incorporating a phase shift control device as defined above.

BRIEF DESCRIPTION OF THE DRAWINGS

Other advantages and characteristics of the invention will become apparent on examining the detailed description of modes of implementation and embodiments, which are in no way limiting, and of the appended drawings, in which.

DETAILED DESCRIPTION OF THE PREFERRED EMBODIMENTS

Figure 1:
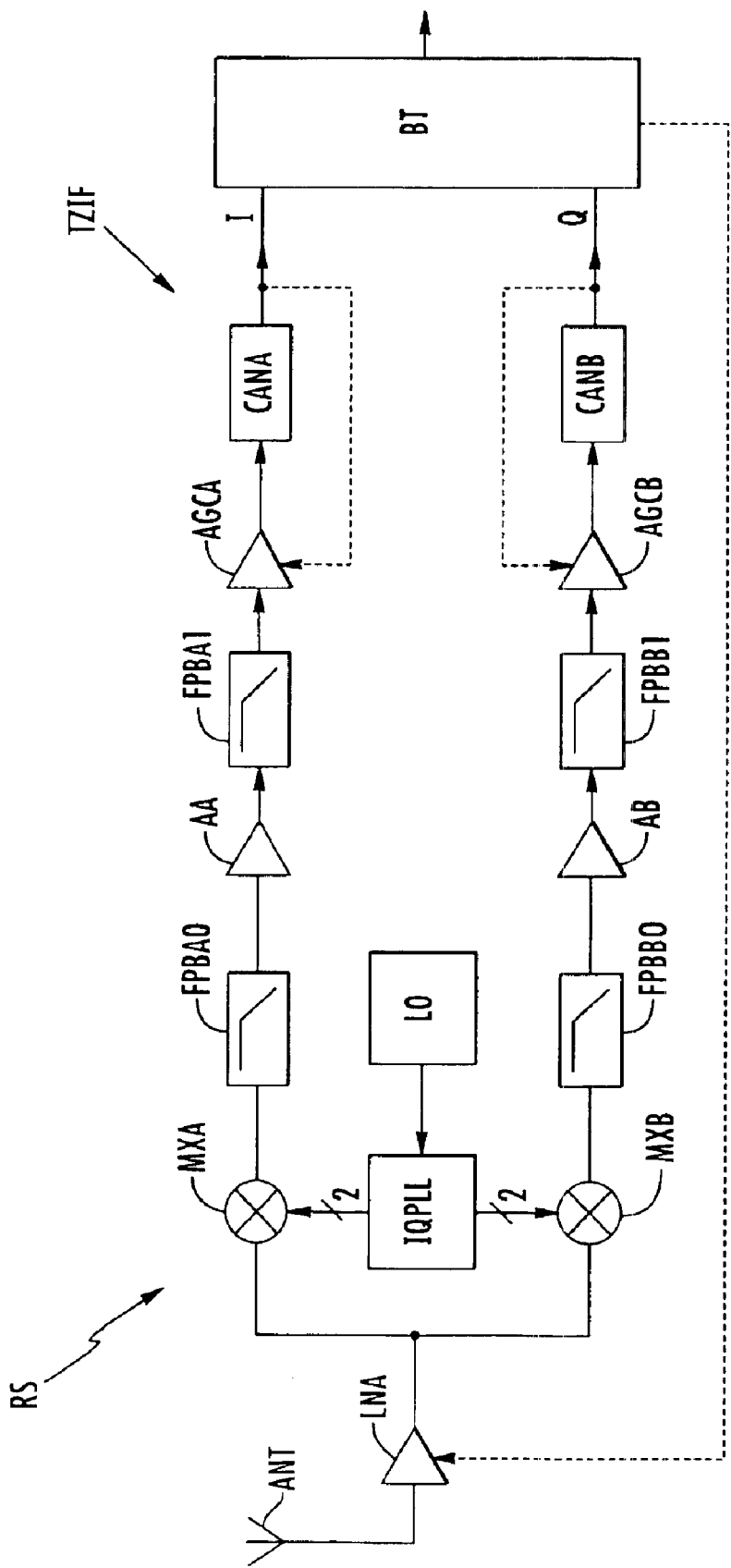
FIG. 1 is a block diagram illustrating a tuning device incorporated into a satellite receiver and containing a phase shift control device according to the present invention.

In FIG. 1, the reference RS denotes a satellite receiver/decoder, i.e., a set-top box, and is connected to a parabolic antenna ANT for receiving digital television signals. The receiver RS receives and decodes these signals, and comprises, at the front end, a tuning device or tuner TZIF for selecting the desired channel from the set of channels present in the signal received at the signal input of the tuner.

The tuner TZIF, advantageously embodied entirely in an integrated fashion on a silicon substrate using CMOS technology, is of the type with a zero intermediate frequency. That is, it does not perform any transposition of frequencies to an intermediate frequency, but includes just a single frequency transposition stage comprising the mixers MXA and MXB, as illustrated. The tuner TZIF directly transposes the signal in the vicinity of the baseband of a channel. The tuner TZIF comprises, at the front end, a variable-gain low-noise amplifier LNA connected between the antenna and the mixers MXA and MXB.

An oscillator LO delivers base signals, in theory, at least two base signals in phase quadrature which respectively exhibit a zero phase and a 90° phase, for example. In practice, however, four signals mutually in phase quadrature are delivered. These base signals are delivered to a device for controlling the phase shift device IQPLL which is composed of a differential-structure phase lock loop. This phase lock loop delivers, as will be discussed in greater detail below, to the mixer MXA two differential signals in phase opposition which respectively exhibit a zero phase and a 180° phase, and delivers to the mixer MXB two other signals in phase opposition but in phase quadrature with respect to the two signals delivered to the mixer MXA.

The processing path containing the mixer MXA is the reference path (I path), whereas the processing path containing the mixer MXB is the quadrature path (Q path). Stated otherwise, the I path represents the in-phase signal, whereas the Q path represents the quadrature signal.

The mixers MXA and MXB are equipped at their outputs with low-pass filters whose cutoff frequency is, for example, a passband on the order of 150 to 250 MHZ. The output signal from the two mixers MXA and MXB is therefore a signal centered around, extending over a frequency band of 150 to 250 MHZ and comprises the selected channel and also the immediately adjacent channels. The width of a channel is on the order of 40 MHZ for high-definition digital television signals. The two baseband filters FPBA0 and FPBB0, which follow the two mixers MXA and MXB, have a passband on the order of 40 MHZ. Consequently, a filtered signal comprising the selected channel is only retrieved at the output of these two baseband filters.

These two baseband filters are followed by fixed-gain amplifiers AA and AB respectively connected to the inputs of analog digital converters CANA and CANB via two other filters FPBA1 and FPBB1 which are anti-aliasing filters, and two controlled-gain amplifiers AGCA and AGCB. These two analog/digital converters CANA and CANB mark the boundary between the analog block of the tuner and the digital block of this tuner.

The two quadrature digital signals I and Q delivered by the analog/digital converters are processed in a computations block BT capable of performing the subsequent conventional precessing of demodulation and channel decoding such as a Viterbi decoding, de-interlacing, Reed-Solomon decoding, and deshuffling to deliver a stream of packets which will be decoded in a source decoding block in accordance with the MPEG standard, for example.

Figure 2:
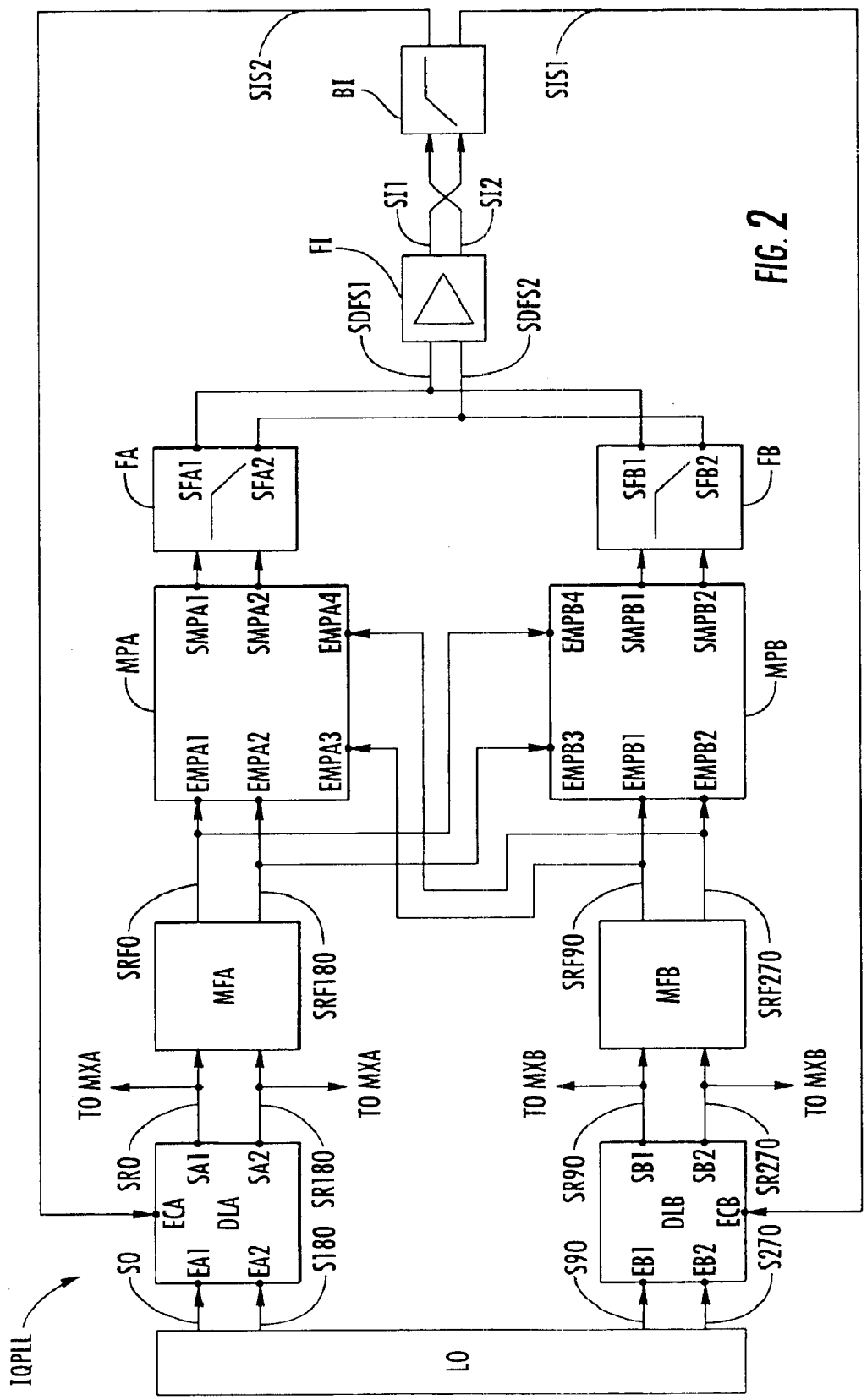
FIG. 2 is a more detailed block diagram illustrating the internal structure of an embodiment of the phase shift control device of FIG. 1.

Reference is now made more particularly to FIG. 2 to describe the phase shift control device IQPLL in greater detail. This device IQPLL, which is a phase lock loop with an entirely differential structure, receives from a local oscillator having a conventional structure four base signals mutually in phase quadrature. More precisely, the first base signal is the signal S0, which is the in-phase reference signal (0° phase). The second base signal is the signal S90, which is a signal in phase quadrature (90° phase) with respect to the first base signal S0. This second base signal S90 is likely to exhibit a quadrature error with respect to the first base signal in view of the technological characteristics of the local oscillator.

The third base signal is the signal S180, which is substantially in phase opposition (phase equal to 180°) with respect to the first base signal S0. The fourth base signal is the signal S270, substantially in phase opposition with respect to the second base signal S90. The two base signals S0 and S180 (I path or I signal) are delivered to the two inputs EA1 and EA2 of a first delay cell DLA, the structure of which will be described in greater detail below. The first delay cell includes a delay control input ECA.

The first delay cell is able to deliver on its two outputs SA1 and SA2 a first pair of delayed signals SR0 and SR180. These signals SR0 and SR180 are delayed by a first adjustable delay. The first delayed signal SR0 of the first pair of delayed signals is delayed with respect to the first base signal S0, and the second delayed signal SR180 is in phase opposition with respect to the first delayed signal SR0. The adjustment of the delay is done via the control arriving on the control input ECA.

Similarly, the device IQPLL also comprises a second delay cell DLB of similar structure to that of the first delay cell DLA. This second delay cell receives on its two inputs EB1 and EB2 the two base signals S90 and S270 (Q path or Q signal), and delivers on its two outputs SB1 and SB2 a second pair of delayed signals SR90 and SR270. These two signals SR90 and SR270 are delayed by a second adjustable delay. The adjustment of this second delay is performed by the command received on the control input ECB of the cell DLB.

The third delay signal SR90, forming part of the second pair of delayed signals, is delayed with respect to the second base signal S90, whereas the fourth delayed signal SR270 is in phase opposition with respect to the third delayed signal SR90. It is these four delayed signals SR0, SR180, SR90 and SR270 which are delivered to the two mixers MXA and MXB of the tuner.

As will be seen in greater detail below, the value of the first delay of the first delay cell DLA and the value of the second delay of the second delay cell DLB are continuously adjusted to obtain the four delayed signals virtually in quadrature, independently of the possible quadrature error between the base signals. The two delayed signals SR0 and SR180, which are for example sinusoidal signals, are then shaped in a conventional shaping circuit MFA to be transformed into square signals (0–1.8 volts, for example) SRF0 and SRF180. Likewise, the two delayed signals SR90 and SR270 are transformed into square signals SRF90 and SRF270 by a shaping circuit MFB.

The device IQPLL also comprises a first mixer MPA, for example, a ring-like passive mixer as will be described below in greater detail. The first mixer MPA receives on two of its inputs EMPA1 and EMPA2 the two shaped signals SRF0 and SRF180, and receives on two other inputs EMPA3 and EMPA4 the two shaped signals SFR90 and SRF270. Stated otherwise, the first mixer MPA mixes the two signals SRF0 and SRF180 directly with the two signals SRF90 and SRF270 which appears to control the mixing. The mixer MPA then delivers on its two outputs SMPA1 and SMPA2 a first pair of differential signals which is representative of the quadrature error between the first delayed signal SR0 and the third delayed signal SR90. The first pair of delayed signals SR0 and SR180 may also be indirectly mixed with the second pair of delayed signals SR90 and SR270.

Likewise, the device IQPLL comprises a second mixer MPB having a similar structure to that of the first mixer MPA, for example, which is connected to the outputs of the first and second delay cells. More precisely, this second mixer receives on two of its inputs EMPB1 and EMPB2 the shaped signals SRF90 and SRF270. It moreover receives on its other two inputs EMPB3 and EMPB4 the shaped signals SRF0 and SRF180.

The second mixer therefore indirectly mixes the second pair of delayed signals SR90 and SR270 with the first pair of delayed signals SR0 and SR180, which appears to be in control of the mixing. The mixer MPB then delivers on its two outputs SMPB1 and SMPB2 a second pair of differential signals which are likewise representative of the quadrature error between the first delayed signal and the third delayed signal.

Stated otherwise, the I path is mixed with the Q path and the Q path is mixed with the I path, thus making it possible to obtain harmonics of the I signals and harmonics of the Q signals, and also two pairs of differential signals. The difference of the two continuous differential signals of each pair is then proportional to the phase shift between the I path and the Q path.

Each of the differential signals delivered on the outputs SMPA1 and SMPA2 is then filtered in a low-pass filter, such as a conventional RC low-pass filter, for example, to obtain at an output SFA1 and SFA2 of this filter FA the mean value of each of the two differential signals. The same operation is performed in a second low-pass filter FB connected to the outputs SMPB1 and SMPB2 of the second mixer MPB.

The mean values delivered at the output of the two low-pass filters are then summed two by two. The summation means is provided by simply linking the output SFB2 of the filter FB with the output SFA2 of the filter FA, and by linking the output SFB1 of the filter FB with the counterpart output SFA1 of the filter FA. A pair of summed filtered differential signals SDFS1 and SDFS2 is obtained at the output of these summation means.

While it would be possible to continuously adjust the value of the first delay of the first delay cell DLA using the signal SDFS2, and to continuously adjust the value of the delay of the second delay cell DLB using the signal SDFS1, it is preferable, for accuracy and noise isolation reasons, to interpose an integrating active filter FI followed by an isolation block BI between the output of the summation means and the control inputs of the delay cells.

The function of the active differential integrating filter FI is to integrate over a predetermined duration each of the differential signals SDFS1 and SDFS2 to increase the level of these signals, and to more accurately adjust the value of the delays using these integrated signals SI1 and SI2. The two integrated signals SI1 and SI2 are then delivered to an isolation block whose function is to isolate the integrating filter from the noise generated by the delay cells DLA and DLB. Also, the value of the delay of each of the delay cells will be adjusted using the signals SIS1 and SIS2 delivered by the isolation block BI.

This adjustment will include increasing the value of one of the two delays and decreasing the value of the other delay to obtain the four delayed signals SR0, SR180, SR90 and SR270 virtually in quadrature independently of the quadrature error. In this regard, it is with the signal SIS1 arising from the first processing path (I path) that the delay of the second delay cell DLB is controlled. Whereas it is with the signal SIS2 arising from the second processing path (Q path) that the delay of the first delay cell DLA is controlled.

Figure 3:
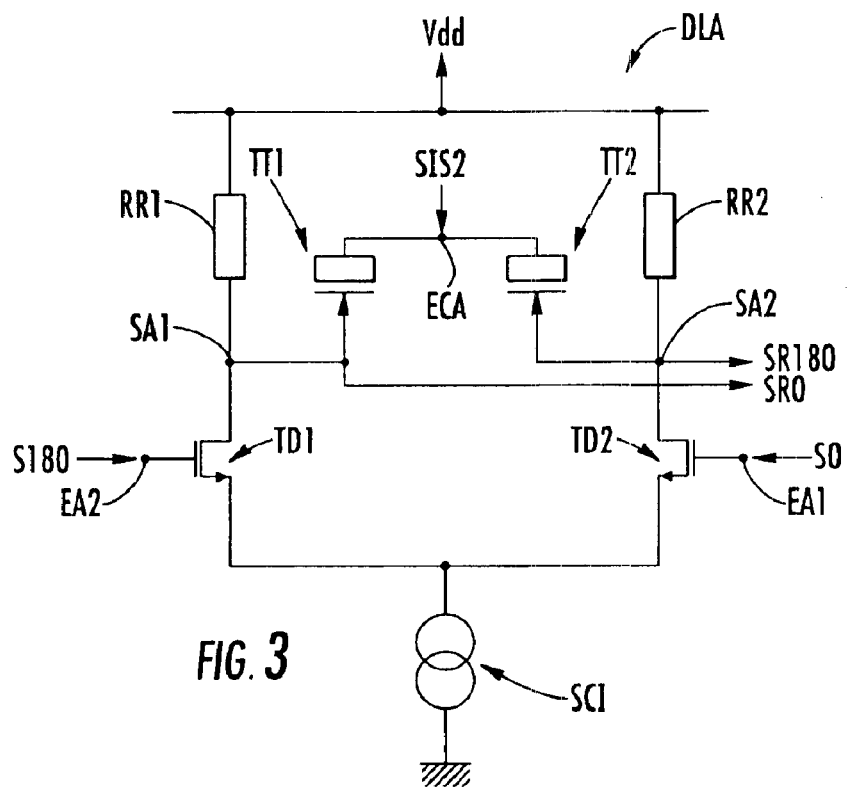
FIG. 3 is a schematic diagram illustrating in greater detail the delay cell DLA of the phase shift control device of FIG. 2.

Although any conventional delay cell structure could be suitable for the present invention, the particular structure illustrated in FIG. 3 has a significant advantage in the sense that such a structure makes it possible automatically to correct any phase shift error between two base signals in phase opposition.

For simplifying purposes, FIG. 3 illustrates the internal structure of the cell DLA. The cell DLB exhibits a similar structure. With such a structure, even if the two base signals S0 and S180 exhibit a phase shift error, the two delayed signals SR0 and SR180 will certainly be delayed with respect to the respective signals S180 and S0, but strictly in phase opposition.

More precisely, such a cell DLA comprises a variable-load differential comparator. This variable-load differential comparator comprises two NMOS transistors TD1 and TD2 whose respective gates form the two inputs EA2 and EA1 of the delay cell. The sources of these two transistors are biased by a current source SCI. The drains of these two transistors are also biased by two biasing resistors RR1 and RR2. The drains of these two transistors respectively form the two outputs SA1 and SA2 of the delay cell.

The two outputs SA1 and SA2 are respectively connected to the gates of two NMOS transistors TT1 and TT2 whose sources and drains are linked together and form the control input ECA of the delay cell. Each NMOS transistor is polarized in the depletion mode for having a capacitive value function of the SIS2 signal level. The level of the signal SIS2 delivered on the control input ECA causes the load (RC product) to vary. If the load increases, the gain increases as does the delay caused by the first delay cell. If, conversely, the load decreases, the gain decreases as does the value of the delay.

Stated otherwise, the delay is controlled by varying the load. This leads to output signals which do not have the same amplitudes. Hence, it is preferable to reshape these signals before driving the MPA and MPB passive mixers having a ring-like structure which will now be described in detail while referring more particularly to FIGS. 4 and 5.

Figure 4:
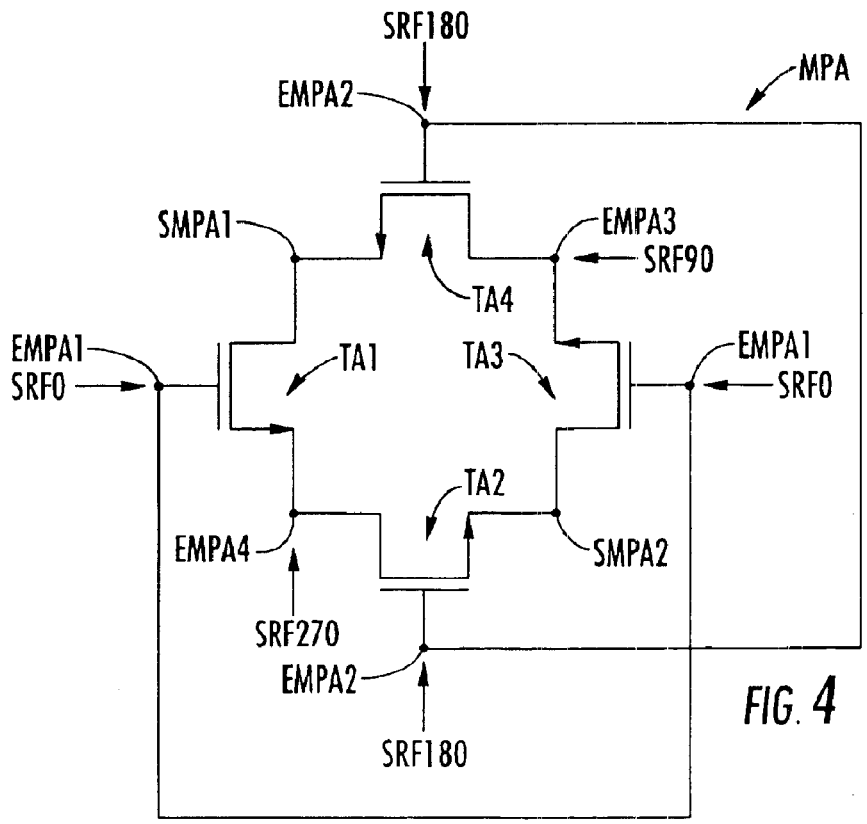
FIG. 4 is a schematic diagram illustrating in greater detail the mixer MPA of the phase shift control device of FIG. 2.

FIG. 4 illustrates the structure of the mixer MPA. The latter includes four NMOS transistors TA1–TA4. The gate of the transistor TA1 is linked to the gate of the transistor TA3. These two gates together form the input EMPA1 of the mixer. Likewise, the gates of the transistors TA2 and TA4 are linked together and form the input EMPA2 of the mixer MPA.

The source of the transistor TA1 is linked to the drain of the transistor TA2 and together form the input EMPA4. The source of the transistor TA3 is linked to the drain of the transistor TA4 and together form the input EMPA3 of the mixer. The source of the transistor TA4 is linked to the drain of the transistor TA1 and together form the output SMPA1, while the source of the transistor TA2 is linked to the drain of the transistor TA3 and together form the output SMPA2.

If perfect quadrature exists between the signals SFR0 and SFR90, then the mean value of the pulsed signal delivered at the output SMPA1 is equal to the mean value of the pulsed signal delivered at the output SMPA2. On the other hand, if a phase shift exists between the signals SFR0 and SFR90, these two mean values are different.

Figure 5:
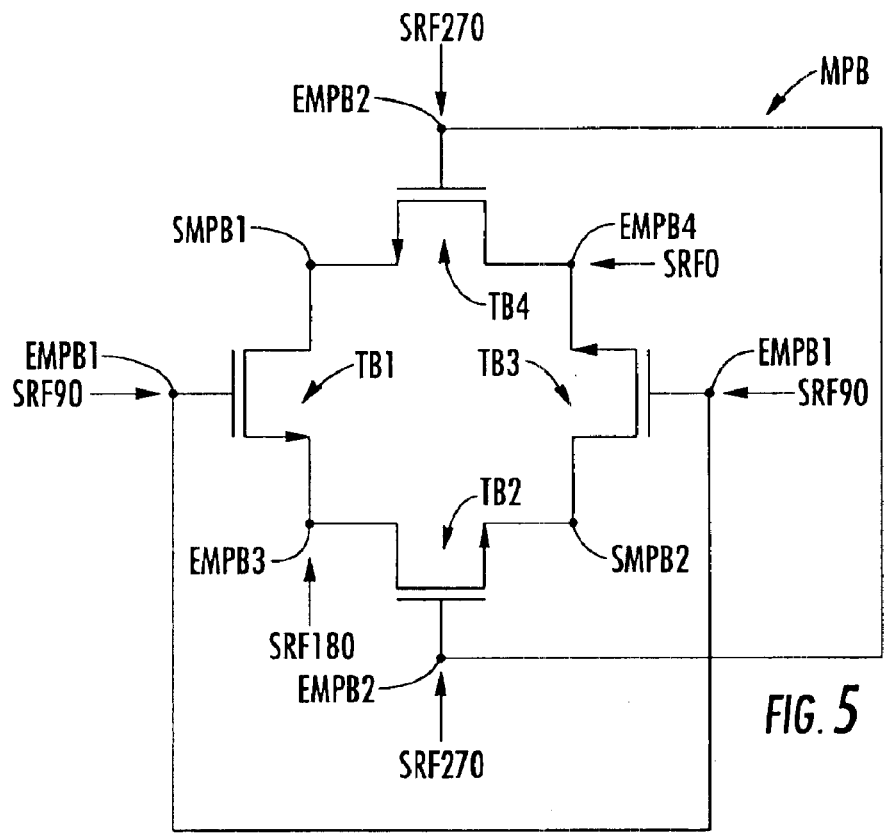
FIG. 5 is a schematic diagram illustrating in greater detail the mixer MPB of the phase shift control device of FIG. 2.

The structure and the manner of operation of the mixer MPB, illustrated in FIG. 5, is similar to that which has just been described with reference to FIG. 4. The use of two mixers makes it possible to balance the loads between the four delayed and shaped signals SRF0, SRF90, SRF180 land SRF270. Moreover, with the transistors operating in an off/on mode, it is particularly advantageous to use square-shaped signals instead of sinusoidal signals.

Finally, the use of NMOS transistors makes it possible to have output signals from the mixers having levels less than Vdd−Vt. Vdd designates the supply voltage, while Vt designates the threshold voltage of an NMOS transistor. Thus, the active integrating filter can operate readily in the linear domain.

Figure 6:
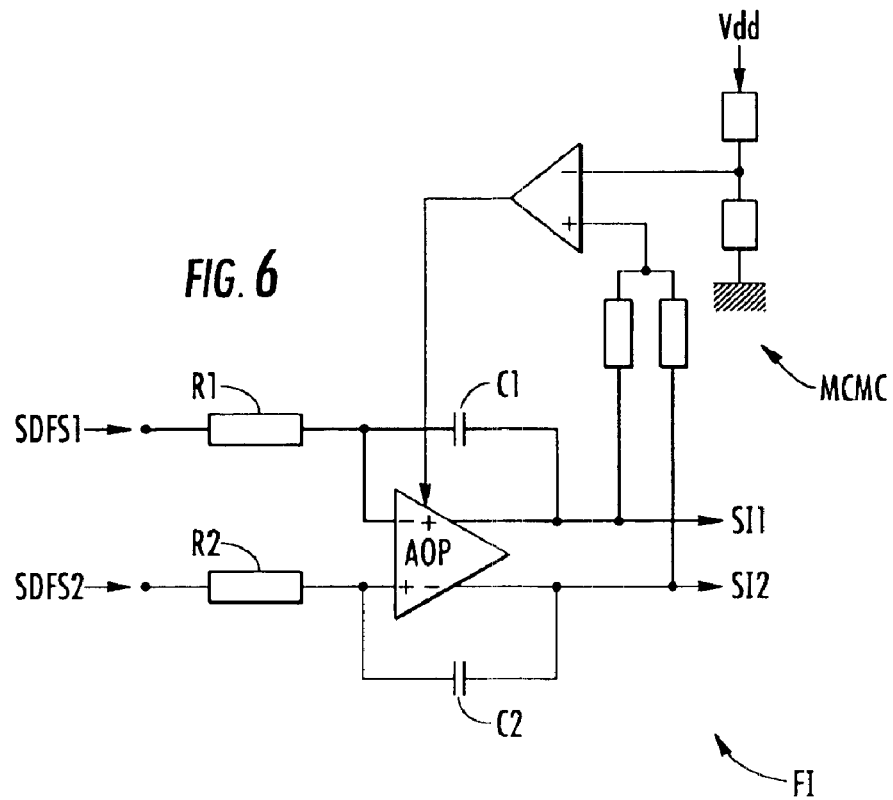
FIG. 6 is a schematic diagram illustrating in greater detail the filter F1 of the phase shift control device of FIG. 2.

After filtering, the signal SDFS1 and the signal SDFS2 are each representative of the difference between the mean values of the two outputs of the two mixers. Each signal SDFS1 and SDFS2 is integrated in the active differential integrating filter, an exemplary structure of which is illustrated in FIG. 6. This filter FI is a resistive/capacitive integrating filter having, for example, a cutoff frequency on the order of 300 KHz. The function of which is to amplify each of the signals SDFS1 and SDFS2 over time.

This active filter comprises an operational differential amplifier AOP, each output of which is linked with regard to the opposite input by way of a capacitor C1, C2. Moreover, resistors R1, R2 are respectively connected between the two inputs of the filter FI and the two inputs of the operational amplifier AOP.

The active filter FI comprises common-mode control means MCMC. More precisely, these means MCMC comprise other resistors connected respectively between the two outputs of the amplifier AOP and one of the inputs (+) of a comparator. The function of these two resistors is to average the two outputs of the amplifier AOP.

The other input (inverting input) of the comparator is linked to the voltage Vdd/2 by way of a resistive bridge connected between the voltage Vdd and ground. The output of the comparator controls the load of the differential operational amplifier AOP. The function of the means MCMC is therefore to fix the common output mode at the voltage Vdd/2. This makes it possible to center the control value of the delays at Vdd/2 to obtain the maximum control span for the delay cells.

Figure 7:
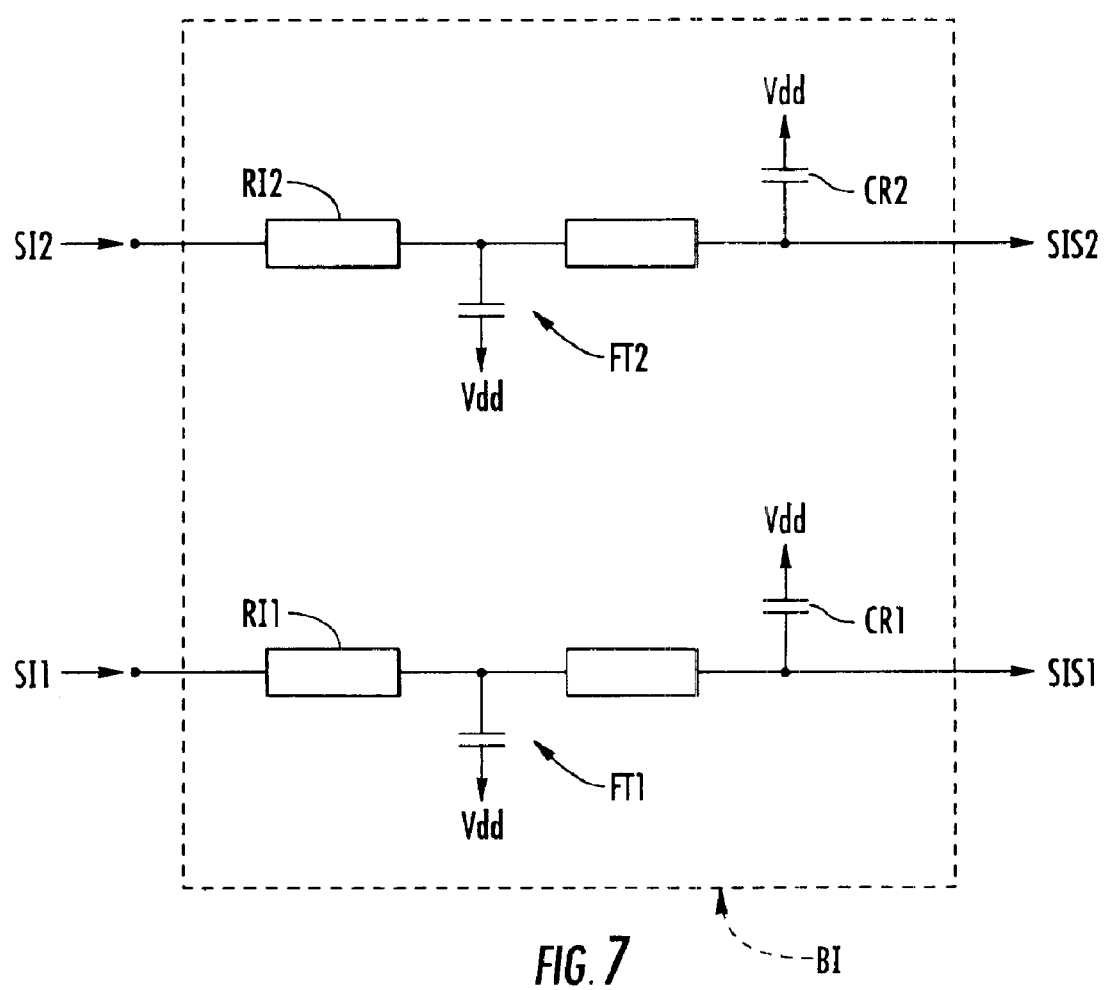
FIG. 7 is a schematic diagram illustrating in greater detail the isolation block B1 of the phase shift control device of FIG. 2.

The structure of the isolation block BI is illustrated in FIG. 7. This block BI comprises two isolation paths exhibiting a similar structure. Each path comprises a T filter, FT1 and FT2. The T filter is a resistive/capacitive filter which appears to function as a low-pass filter as seen from the delay cells.

In order that the capacitance of the T filter should not be directly connected to the corresponding output of the operational amplifier, provision is made for an isolating resistor RI1 and RI2. Finally, capacitors CR1, CR2 are connected between the output of each T filter and the supply voltage Vdd. These two capacitors form energy reservoirs in the event of a dip in supply, and thus enable the potential on the corresponding delay cell to be better maintained.

According to the invention, a fully differential phase locked loop IQPLL has been completely integrated using 0.18 micron CMOS technology. For example, the IQPLL circuit can correct LO quadrature error between 0.9 and 2.3 GHz with a maximum phase correction capability of ±0.8°/100 MHz. Moreover the output phase noise is improved by the IQPLL circuit implementation within its closed loop bandwidth of −3 dB on each LO signal and −20 dB/decade differentially.

That which is claimed is:

1. A process for controlling a phase shift between four signals mutually in phase quadrature comprising:

generating at least one first base signal, and at least one second base signal in quadrature with respect to the at least one first base signal and having a quadrature error with respect to the at least one first base signal;

generating a first pair of signals delayed by a first adjustable delay, the first pair of signals comprising a first delayed signal delayed with respect to the at least one first base signal and a second delayed signal delayed in phase opposition with respect to the first delayed signal;

generating a second pair of signals delayed by a second adjustable delay, the second pair of signals comprising a third delayed signal delayed with respect to the at least one second base signal and a fourth delayed signal delayed in phase opposition with respect to the third delayed signal; and adjusting a value of each of the first and second adjustable delays using first and second differential signals arising from a mixing of the first and second pairs of delayed signals to increase the value of one of the first and second adjustable delays and to decrease the value of the other one of the first and second adjustable delays to obtain the four delayed signals mutually in phase quadrature independently of the quadrature error.

2. A process according to claim 1, wherein the adjusting is performed continuously.

3. A process according to claim 1, wherein the mixing comprises at least one of a direct mixing of the first and second pairs of delayed signals and an indirect mixing of the first and second pairs of delayed signals.

4. A process according to claim 1, wherein the mixing of the first and second pairs of delayed signals comprises:

mixing the first pair of delayed signals with the second pair of delayed signals for generating a first pair of differential signals representative of a quadrature error between the first delayed signal and the third delayed signal; and mixing the second pair of delayed signals with the first pair of delayed signals for generating a second pair of differential signals representative of the quadrature error between the first delayed signal and the third delayed signal.

5. A process according to claim 4, further comprising:
   filtering the first and second pairs of differential signals; and
   summing the filtered first and second pairs of differential signals to obtain a pair of summed filtered differential signals.

6. A process according to claim 5, wherein the value of the first adjustable delay is adjusted using one of the pairs of the summed filtered differential signals while the value of the second adjustable delay is adjusted using the other one of the pairs of the summed filtered differential signals to increase the value of one of the first and second adjustable delays and to decrease the value of the other one of the first and second adjustable delays.

7. A process according to claim 1, further comprising shaping the first and second pairs of delayed signals before mixing.

8. A process according to claim 5, further comprising integrating the pair of summed filtered differential signals to generate the first and second differential signals.

9. A process according to claim 8, wherein the integrating is isolated from noise generated when the first and second pairs of signals are delayed.

10. A process according to claim 1, wherein the at least one first base signal comprises a first base signal and a third base signal substantially in phase opposition with respect to the first base signal; and wherein the at least one second base signal comprises a second base signal and a fourth base signal substantially in phase opposition with respect to the second base signal.

11. A process for controlling a phase shift between four signals mutually in phase quadrature comprising:
   generating a first base signal and a third base signal substantially in phase opposition with respect to the first base signal;
   generating a second base signal in quadrature with respect to the first base signal and having a quadrature error with respect to the first base signal, and a fourth base signal substantially in phase opposition with respect to the second base signal and in quadrature with respect to the third base signal and having a quadrature error with respect to the third base signal;
   generating a first pair of signals delayed by a first adjustable delay, the first pair of signals comprising a first delayed signal delayed with respect to the first base signal and a second delayed signal delayed with respect to the third base signal;
   generating a second pair of signals delayed by a second adjustable delay, the second pair of signals comprising a third delayed signal delayed with respect to the second base signal and a fourth delayed signal delayed with respect to the fourth base signal; and
   adjusting a value of each of the first and second adjustable delays using first and second differential signals to increase the value of one of the first and second adjustable delays and to decrease the value of the other one of the first and second adjustable delays to obtain the four delayed signals mutually in phase quadrature independently of the quadrature error.

12. A process according to claim 11, wherein the first and second differential signals arise from a mixing of the first and second pairs of delayed signals.

13. A process according to claim 12, wherein the mixing of the first and second pairs of delayed signals comprises:
   mixing the first pair of delayed signals with the second pair of delayed signals for generating a first pair of differential signals representative of a quadrature error between the first delayed signal and the third delayed signal; and
   mixing the second pair of delayed signals with the first pair of delayed signals for generating a second pair of differential signals representative of the quadrature error between the first delayed signal and the third delayed signal.

14. A process according to claim 13, further comprising:
   filtering the first and second pairs of differential signals; and
   summing the filtered first and second pairs of differential signals to obtain a pair of summed filtered differential signals.

15. A process according to claim 14, wherein the value of the first adjustable delay is adjusted using one of the pairs of the summed filtered differential signals while the value of the second adjustable delay is adjusted using the other one of the pairs of the summed filtered differential signals to increase the value of one of the first and second adjustable delays and to decrease the value of the other one of the first and second adjustable delays.

16. A process according to claim 14, further comprising integrating the pair of summed filtered differential signals to generate the first and second differential signals.

17. A phase shift control device comprising:
   a generator for generating at least one first base signal, and for generating at least one second base signal in quadrature with respect to the at least one first base signal and having a quadrature error with respect to the at least one first base signal;
   a first delay cell for receiving the at least one first base signal and comprising a delay control input for generating a first pair of signals delayed by a first adjustable delay, the first pair of signals comprising a first delayed signal delayed with respect to the at least one first base signal and a second delayed signal delayed in phase opposition with respect to the first delayed signal;
   a second delay cell for receiving the at least one second base signal and comprising a delay control input for generating a second pair of signals delayed by a second adjustable delay, the second pair of signals comprising a third delayed signal delayed with respect to the at least one second base signal and a fourth delayed signal delayed in phase opposition with respect to the third delayed signal; and
   differential means of adjustment connected between outputs of said first and second delay cells and their respective delay control inputs for adjusting a value of each of the first and second adjustable delays using first and second differential signals to increase the value of one of the first and second adjustable delays and to decrease the value of the other one of the first and second adjustable delays to obtain four delayed signals mutually in phase quadrature independently of the quadrature error.

18. A phase shift control device according to claim 17, wherein the first and second differential signals arise from a mixing of the first and second pairs of delayed signals.

19. A phase shift control device according to claim 17, wherein said differential means of adjustment comprises:
   a first mixer connected to the outputs of said first and second delay cells for mixing the first pair of delayed signals with the second pair of delayed signals for generating a first pair of differential signals representative of the quadrature error between the first delayed signal and the third delayed signal; and a second mixer connected to the outputs of the first and second delay cells for mixing the second pair of delayed signals with the first pair of delayed signals for generating a second pair of differential signals representative of the quadrature error between the first delayed signal and the third delayed signal.

20. A phase shift control device according to claim 19, further comprising:
a first low-pass filter connected to outputs of said first mixer;
a second low-pass filter connected to outputs of said second mixer; and
a summing network connected to outputs of said first and second low-pass filters, and having a first output providing a first pair of summed filtered differential signals and a second output providing a second pair of summed filtered differential signals, the first and second outputs respectively connected to the delay control inputs of said first and second delay cells so that the value of the first adjustable delay is adjusted using one of the pairs of summed filtered differential signals while the value of the second adjustable delay is adjusted using the other one of the pairs of summed filtered differential signals to increase the value of one of the first and second adjustable delays and to decrease the value of the other one of the first and second adjustable delays.

21. A phase shift control device according to claim 20, further comprising an active differential integrating filter with a common mode control connected between said summing network and the two delay control inputs of said first and second delay cells.

22. A phase shift control device according to claim 19, wherein the at least one first base signal comprises a first base signal and a third base signal substantially in phase opposition with respect to the first base signal; and wherein the at least one second base signal comprises a second base signal and a fourth base signal substantially in phase opposition with respect to the second base signal.

23. A phase shift control device according to claim 19, further comprising a semiconductor substrate, and wherein said first and second delay cells and said differential means of adjustment are integrated thereon.

24. A satellite digital television receiver comprising:
an input amplifier for amplifying digital television signals;
a phase shift control device comprising
a generator for generating at least one first base signal, and for generating at least one second base signal in quadrature with respect to the at least one first base signal and having a quadrature error with respect to the at least one first base signal,
a first delay cell for receiving the at least one first base signal and comprising a delay control input for generating a first pair of signals delayed by a first adjustable delay, the first pair of signals comprising a first delayed signal delayed with respect to the at least one first base signal and a second delayed signal delayed in phase opposition with respect to the first delayed signal,
a second delay cell for receiving the at least one second base signal and comprising a delay control input for generating a second pair of signals delayed by a second adjustable delay, the second pair of signals comprising a third delayed signal delayed with respect to the at least one second base signal and a fourth delayed signal delayed in phase opposition with respect to the third delayed signal, and a differential adjustment circuit connected between outputs of said first and second delay cells and their respective delay control inputs for adjusting a value of each of the first and second adjustable delays using first and second differential signals to increase the value of one of the first and second adjustable delays and to decrease the value of the other one of the first and second adjustable delays to obtain four delayed signals mutually in phase quadrature independently of the quadrature error;
a first tuner mixer connected to said amplifier for receiving amplified digital television signals and connected to said phase shift control device for receiving the first and second delayed signals, and an output for providing a reference signal;
a second tuner mixer connected to said amplifier for receiving the amplified digital television signals and connected to said phase shift control device for receiving the third and fourth delayed signals, and an output for providing a quadrature signal;
a first analog/digital converter for converting the reference signal to a digital reference signal;
a second analog/digital converter for converting the quadrature signal to a digital quadrature signal; and
a computation circuit for processing the digital reference and quadrature signals.

25. A satellite digital television receiver according to claim 24, wherein the digital television signals are defined according to a Digital Video Broadcasting-Satellite European specification.

26. A satellite digital television receiver according to claim 24, wherein said differential adjustment circuit comprises:
a first mixer connected to the outputs of said first and second delay cells for mixing the first pair of delayed signals with the second pair of delayed signals for generating a first pair of differential signals representative of the quadrature error between the first delayed signal and the third delayed signal; and
a second mixer connected to the outputs of the first and second delay cells for mixing the second pair of delayed signals with the first pair of delayed signals for generating a second pair of differential signals representative of the quadrature error between the first delayed signal and the third delayed signal.

27. A satellite digital television receiver according to claim 26, wherein said phase shift control device further comprises:
a first low-pass filter connected to outputs of said first mixer;
a second low-pass filter connected to outputs of said second mixer; and
a summing network connected to outputs of said first and second low-pass filters, and having a first output providing a first pair of summed filtered differential signals and a second output providing a second pair of summed filtered differential signals, the first and second outputs respectively connected to the delay control inputs of said first and second delay cells so that the value of the first adjustable delay is adjusted using one of the pairs of summed filtered differential signals while the value of the second adjustable delay is adjusted using the other one of the pairs of summed filtered differential signals to increase the value of one of the first and second adjustable delays and to decrease the value of the other one of the first and second adjustable delays.

28. A satellite digital television receiver according to claim 27, wherein said phase shift control device further comprises an active differential integrating filter with a common mode control connected between said summing network and the two delay control inputs of said first and second delay cells.

29. A satellite digital television receiver according to claim 24, wherein the at least one first base signal comprises a first base signal and a third base signal substantially in phase opposition with respect to the first base signal; and wherein the at least one second base signal comprises a second base signal and a fourth base signal substantially in phase opposition with respect to the second base signal.

* * * * *